United States Patent
Or et al.

(10) Patent No.: US 6,364,949 B1
(45) Date of Patent: *Apr. 2, 2002

(54) 300 MM CVD CHAMBER DESIGN FOR METAL-ORGANIC THIN FILM DEPOSITION

(75) Inventors: David T. Or, San Jose; Keith K. Koai, Los Gatos; Fufa Chen, Cupertino; Lawrence C. Lei, Milpitas, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/421,779

(22) Filed: Oct. 19, 1999

(51) Int. Cl.⁷ ................................................ B05C 11/06
(52) U.S. Cl. .................... 118/69; 118/724; 118/715; 427/573; 427/576
(58) Field of Search ................. 118/715, 724; 427/573, 576

(56) References Cited

U.S. PATENT DOCUMENTS

| 5,000,113 A | 3/1991 | Wang et al. ............ 118/723 E |
| 5,866,213 A | * 2/1999 | Foster et al. ................ 427/573 |
| 6,051,286 A | * 7/2000 | Zhoa et al. .................. 427/576 |
| 6,086,677 A | * 7/2000 | Umotoy et al. ............ 118/715 |

OTHER PUBLICATIONS

U.S. patent application Ser. No. 08/927,700, Somekh, "Vaporization and Deposition Apoparatus and Process".

* cited by examiner

*Primary Examiner*—Gregory Mills
*Assistant Examiner*—Rudy Zervigon
(74) *Attorney, Agent, or Firm*—Moser, Patterson & Sheridan LLP

(57) ABSTRACT

The present invention relates to plasma-enhanced chemical vapor deposition (PECVD) and related chamber hardware. Embodiments of the present invention include a PECVD system for depositing a film of titanium nitride from a TDMAT precursor. The present invention broadly provides a chamber, a gas delivery assembly, a pedestal which supports a substrate, and a plasma system to process substrates. In general, the invention includes a chamber body and a gas delivery assembly disposed thereon to define a chamber cavity. A pedestal movably disposed within the chamber cavity is adapted to support a substrate during processing. The gas delivery assembly is supported by the chamber body and includes a temperature control plate and a showerhead mounted thereto. Preferably, the interface between the showerhead and temperature control plate is parallel to a radial direction of the gas delivery assembly to accommodate lateral thermal expansion without separation of the showerhead and the temperature control plate. A blocker plate, or baffle plate, may be disposed between the showerhead and temperature control plate to facilitate dispersion of gases delivered thereto.

33 Claims, 11 Drawing Sheets

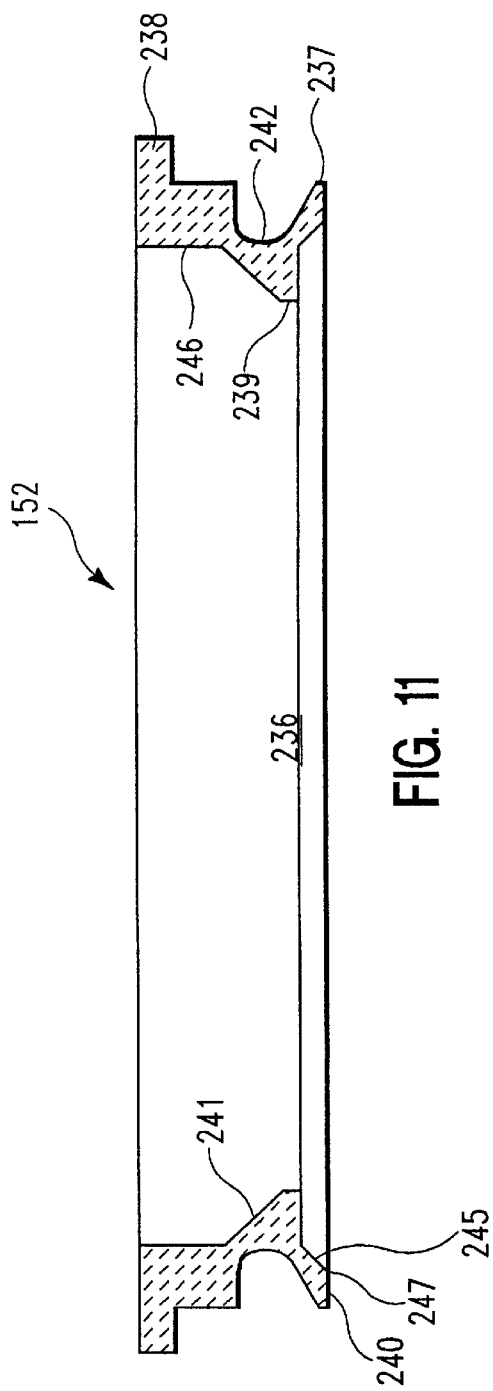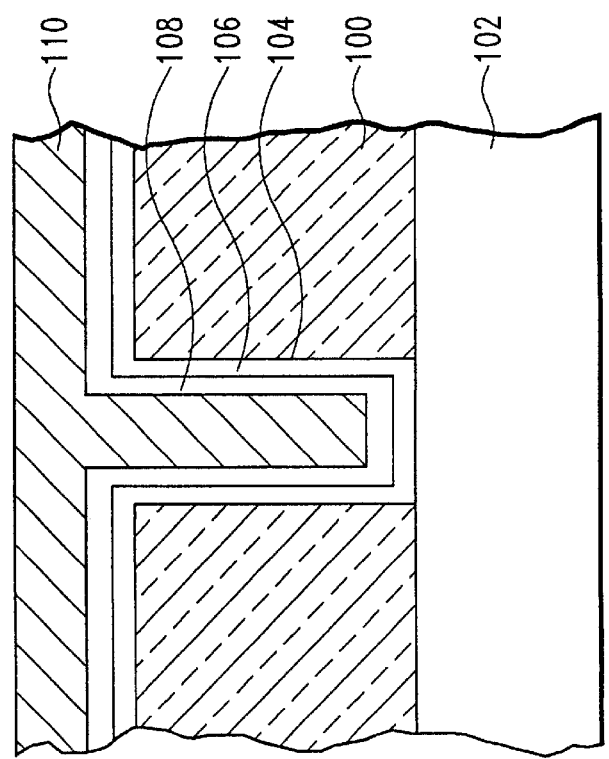
FIG. 11
FIG. 12

300 MM CVD CHAMBER DESIGN FOR METAL-ORGANIC THIN FILM DEPOSITION

BACKGROUND OF THE INVENTION

1. Field of the Invention

This invention is related to semiconductor processing equipment. More specifically, this invention relates to a processing chamber for semiconductor processing and methods for confining plasma gas within a processing zone of the processing chamber.

2. Background of the Related Art

Semiconductor integrated circuits are fabricated with multiple layers of semiconductive, insulating, and conductive materials, as well as additional layers providing functions such as bonding, a migration barrier, and an ohmic contact. Thin films of these various materials are deposited or formed in a number of ways, the most common of which in modern processing are physical vapor deposition (PVD), also known as sputtering, and chemical vapor deposition (CVD).

In CVD, a substrate, for example a silicon substrate, which may already have patterned layers of silicon or other materials formed thereon, is exposed to a precursor gas which reacts at the surface of the substrate and deposits a product of the reaction, e.g. TiN, Al, etc., on the substrate to grow a film thereon. This surface reaction can be activated in at least two different ways. In a thermal process, the substrate is heated to a sufficiently high temperature to provide the activation energy necessary to cause the precursor gas adjacent to the substrate to react and deposit a layer on the substrate. In a plasma-enhanced CVD process (PECVD), the precursor gas is subjected to a sufficiently high electromagnetic field which excites the precursor gas into energetic states, such as ions or radicals, which react on the substrate surface to form the desired material.

One type of CVD chamber commercially available from Applied Materials, Inc., of Santa Clara, Calif., is known as a CVD DxZ Chamber and is illustrated in the cross-sectional side view of FIG. 1. The CVD chamber 30 includes a pedestal 32 having a supporting surface 34 on which a substrate 36 is supported for chemical vapor deposition of a desired material thereon. Positioning the substrate 36 on the supporting surface is facilitated by vertically movable lift pins 38.

A gas delivery assembly 31 is disposed on a lid rim 66 at an upper end of the chamber body 72 and includes a gas distribution faceplate 40, often referred to as a showerhead, and a gas-feed cover plate 46, or temperature control plate, disposed on the showerhead 40 and in thermal communication therewith. An annular flange 47, (shown in FIG. 2) which is an integral component of the showerhead 40, is disposed on an isolator 64 to support the gas delivery assembly 31. A plurality of holes 42 are formed in the showerhead 40 and are adapted to accommodate gas flow therethrough into the process region 56. The gas is provided to the showerhead 40 by a central gas inlet 44 formed in the gas-feed cover plate 46. The gas-feed cover plate 46 also includes a multi-turn cooling/heating channel 33 to accommodate the flow of water or other fluid therethrough during processing in order to maintain the gas delivery assembly 31 at a desired temperature. The gas delivery assembly 31 may be cooled or heated depending on the particular chemicals being delivered through the central gas inlet 44. In operation, the temperature controlled gas delivery assembly 31 is intended to contribute to uniform deposition and prevents gas decomposition, deposition, or condensation within the gas distribution system upstream from the process zone.

In addition to assisting in gas delivery into the chamber 30, the showerhead 40 also acts as an electrode. During processing, a power source 94 (FIG. 1) supplies power to the showerhead 40 to facilitate the generation of a plasma. The power source 94 may be DC or RF.

In operation, a substrate 36 is positioned on the pedestal 32 through cooperation of a robot (not shown) and the lift pins 38. The pedestal 32 then raises the substrate 36 into close opposition to the showerhead 40. Process gas is then injected into the chamber 30 through the central gas inlet 44 in the gas-feed cover plate 46 to the back of the showerhead 40. The process gas then passes through the holes 42 and into the processing region 56 and towards the substrate 36, as indicated by the arrows. Upon reaching the substrate 36, the process gases react with the upper surface thereof. Subsequently, the process gas byproducts flow radially outwardly across the edge of the substrate 36, into a pumping channel 60 and are then exhausted from the chamber 30 by a vacuum system 82.

However, PECVD processes have demonstrated some problems with deposition uniformity, reproducibility and reliability. It is believed that the problems originate from temperature gradients over various chamber component surfaces as well as from extraneous metal depositions on the chamber surfaces affecting the plasma and producing excess particles within the chamber. With regard to extraneous metal deposition, it is believed that the deposition occurs in two different areas, an area at the top of the pedestal 32 outside of the substrate 36 and an area in and around the pumping channel 60.

One problem associated with conventional CVD chambers is the temperature non-uniformity over the surface of the showerhead 40. As a result of the power applied to the showerhead 40 by the power source 94, the temperature of the showerhead 40 increases over time until reaching thermal stabilization which is determined, in part, by the thermal exchange between the showerhead 40 and the plasma, and the showerhead 40 and the gas-feed cover plate 46. While acceptable results were achieved for 200 mm chambers, thermal stability and uniformity worsened as the chambers were scaled up to accommodate larger substrates, such as 300 mm substrates. Because the uniformity of deposition is at least partially dependent on temperature, the resultant temperature gradient over the surface of the showerhead 40 produces non-uniform deposition on the substrate.

One cause of temperature non-uniformity throughout the bulk of the showerhead 40, is design features of conventional lid assemblies provided to accommodate thermal stresses during operation. For example, referring to FIG. 2, the gas-feed cover plate 46 is shown disposed on the showerhead 40. The outer annular wall 35 of the gas-feed cover plate 46 is in facing relation to the inner annular wall 37 of the showerhead 40 to define a gap 39 therebetween. While preferably minimized or nonexistent at room temperature, the gap 39 is widened during processing due to the differing coefficients of expansion of the gas-feed cover plate 46 and the showerhead 40 which causes the showerhead 40 to expand to a greater degree. As a result, the gap 39 acts to insulate the gas-feed cover plate 46 and the showerhead 40 from one another, thereby inhibiting thermal exchange.

Temperature non-uniformity over the surface of the showerhead is also a result of the limitation of space which require that the dimensions of the gas delivery assembly 31 be minimized in order to reduced the cost of manufacturing and operation. In order to ensure the desired heating or cooling of the gas delivery assembly 31, the gas-feed cover plate 46 requires sufficiently large dimensions to accommodate the cooling channel 33. As a result of the large size of the gas-feed cover plate 46, the showerhead thickness is minimized to achieve a compact gas delivery assembly 31. In scaling up to accommodate larger substrates, it was initially believed that the ratio of dimensions could be maintained without a loss of deposition uniformity. However, 1:1 scale-up results in thermal non-uniformity over the surface of the showerhead 40. In particular, the center of the showerhead 40 experiences considerably higher temperatures relative to the edge, thereby resulting in a temperature gradient from center to edge. As a result of the temperature gradient, deposition on the substrate is non-uniform which can lead to defective devices.

FIG. 3 is a graphical representation of the temperature profile for a conventional showerhead which was scaled up to accommodate 300 mm substrates. The scale up ratios were approximately 1:1, meaning that the ratios of dimensions for the components were held equal. The applied power to the showerhead was about 920 W and the thermal contact resistance, Rc, was about $5\times10^{-4}$ $m^2K/W$ where Rc is defined as the ratio of the change in temperature between two surfaces and the heat flux across the surfaces ($\Delta T/q$). Three curves 41, 43, 45 are shown in FIG. 3 representing the temperature fluctuations for the center, mid-portion, and edge, respectively, of the showerhead 40 for six substrates. The substrates are numbered S1–S6 and the process cycle for each corresponds to the upward sloping portion of the curves 41, 43, 45. The temperature gradient for the center, $\Delta T_1$, for the six substrates is about 13° C. and the temperature uniformity spread, $\Delta T_2$, is about 5° C., where $\Delta T_1$ is defined as the change in temperature at the center of the showerhead 40 from the sixth substrate to the first (($T_{center}$) $6^{th}$-($T_{center}$)$1^{st}$) and $\Delta T_2$ is defined as the difference of the center-to-edge temperature gradient between the sixth substrate and the first substrate (($T_{center}$-$T_{edge}$)$6^{th}$-($T_{center}$-$T_{edge}$)$1^{st}$, shown in FIG. 3 as $\Delta T_4$-66 $T_3$). Further, the difference in temperature $\Delta T_3$ between the center and the edge for the first substrate, S1, is about 11.0° C. and the difference in temperature $\Delta T_4$ between the center and the edge for the sixth substrate, S6, is about 16° C. Thus, the showerhead 40 exhibited large center-to-edge temperature gradients during processing which resulted in non-uniform deposition on substrates. In addition, FIG. 3 shows no tendency of stabilization at a steady state. Thus, the temperatures at each point in the showerhead 40 show significant increases with time as represented by upward sloping curves 41, 43, 45, and the rate of heat transfer from center to edge is also in flux as indicated by $\Delta T_3$ and $\Delta T_4$.

Another problem associated with conventional CVD chambers relates to extraneous metal deposition or buildup. Extraneous metal deposition arises because material, such as TiN, is deposited on chamber surfaces exposed to the process gas along its path from the showerhead 40 to the chamber vacuum system 82. The metal deposits can cause an electrical short between the electrically biased showerhead 40 and grounded chamber components. Material buildup leads to undesirable effects during processing which can result in defective devices. One detrimental effect of material buildup is a reduction in plasma uniformity. Plasma uniformity in the processing region 56 depends on the distance between the powered electrodes and surrounding surfaces and the difference between their respective electrical potentials. When, during a long process run, insulating components disposed in the chamber 30 effectively change from being insulators to being grounded conductors, the location and quality of the plasma will be affected. The distortion of the plasma due to the proximity of an adjacent electrical ground causes non-uniformity in the plasma. During plasma processing, variations in uniformity and intensity of the plasma will affect the surface uniformity of the film produced and reduce the process repeatability.

In addition to affecting the plasma uniformity, deposits within the chamber can also result in arcing. In some cases, the arcing may occur near the substrate. Arcing can create particles and defects on the substrate. Therefore, arcing to the substrate should be avoided and the uniformity of the envelope for the plasma adjacent the surface of the substrate should be held as uniform as possible.

Therefore, there is a need for a CVD chamber that does not possess the problems of temperature non-uniformity, plasma instability and arcing and where the frequency for routine maintenance and cleaning is reduced.

SUMMARY OF THE INVENTION

Preferred embodiments of the invention provide a system for processing of substrates in a plasma-enhanced chemical vapor deposition (PECVD) chamber. Embodiments of the present invention include a PECVD system for depositing a film of titanium nitride from a TDMAT precursor. The present invention broadly provides an apparatus for processing substrates that includes a chamber, a gas delivery assembly, a pedestal which supports a substrate, and a plasma system.

In one aspect of the invention, a gas delivery assembly is provided to supply one or more gases to a chamber. The gas delivery assembly generally includes a temperature control plate and a showerhead mounted thereto. Preferably, the interface between the showerhead and temperature control plate is parallel to a radial direction of the gas delivery assembly to accommodate lateral thermal expansion without separation of the showerhead and the temperature control plate. A blocker plate, or baffle plate, may be disposed between the showerhead and temperature control plate to facilitate dispersion of gases delivered thereto.

In another aspect of the invention, a processing chamber includes a chamber body and a lid assembly disposed thereon to define a chamber cavity. A pedestal movably disposed within the chamber cavity is adapted to support a substrate during processing. The lid assembly is supported by the chamber body and includes an isolator ring member and a gas delivery assembly supported thereon. The gas delivery assembly generally includes a temperature control plate and a showerhead mounted thereto. Preferably, the interface between the showerhead and temperature control plate is parallel to a radial direction of the gas delivery assembly to accommodate lateral thermal expansion without separation of the showerhead and the temperature control plate. In one embodiment, the processing chamber further includes one or more chamber inserts and/or liners. The chamber inserts and/or liners are adapted to control plasma uniformity and arcing and are readily removable for cleaning.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 11 is a sectional view of the isolator ring of the present invention.

FIG. 12 shows a cross section of a feature formed in a substrate and having layers deposited thereon.

DETAILED DESCRIPTION OF THE PREFERRED EMBODIMENT

Figure 4:
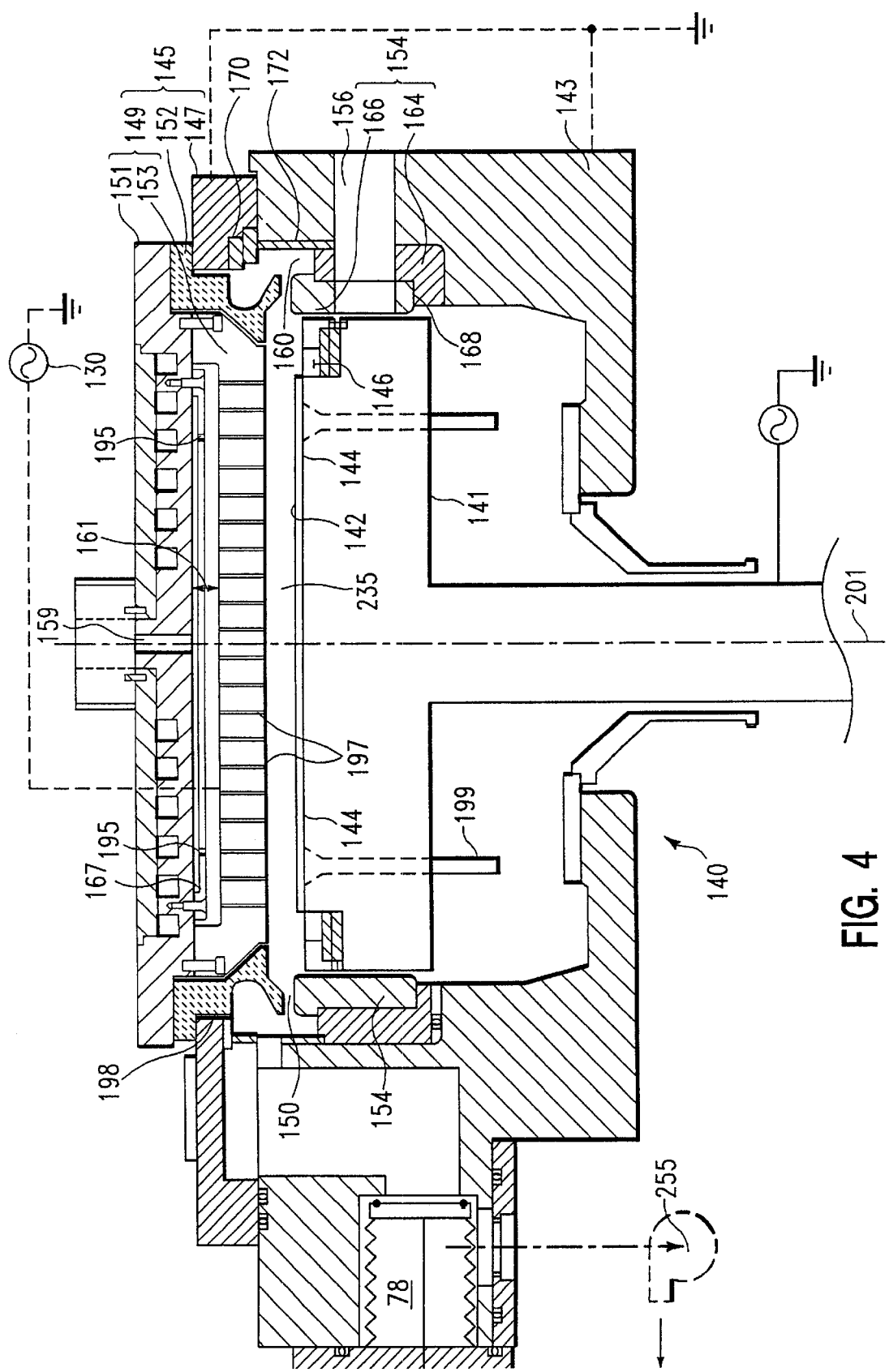
FIG. 4 is a cross-sectional view of a processing chamber of the present invention.
Figure 5:
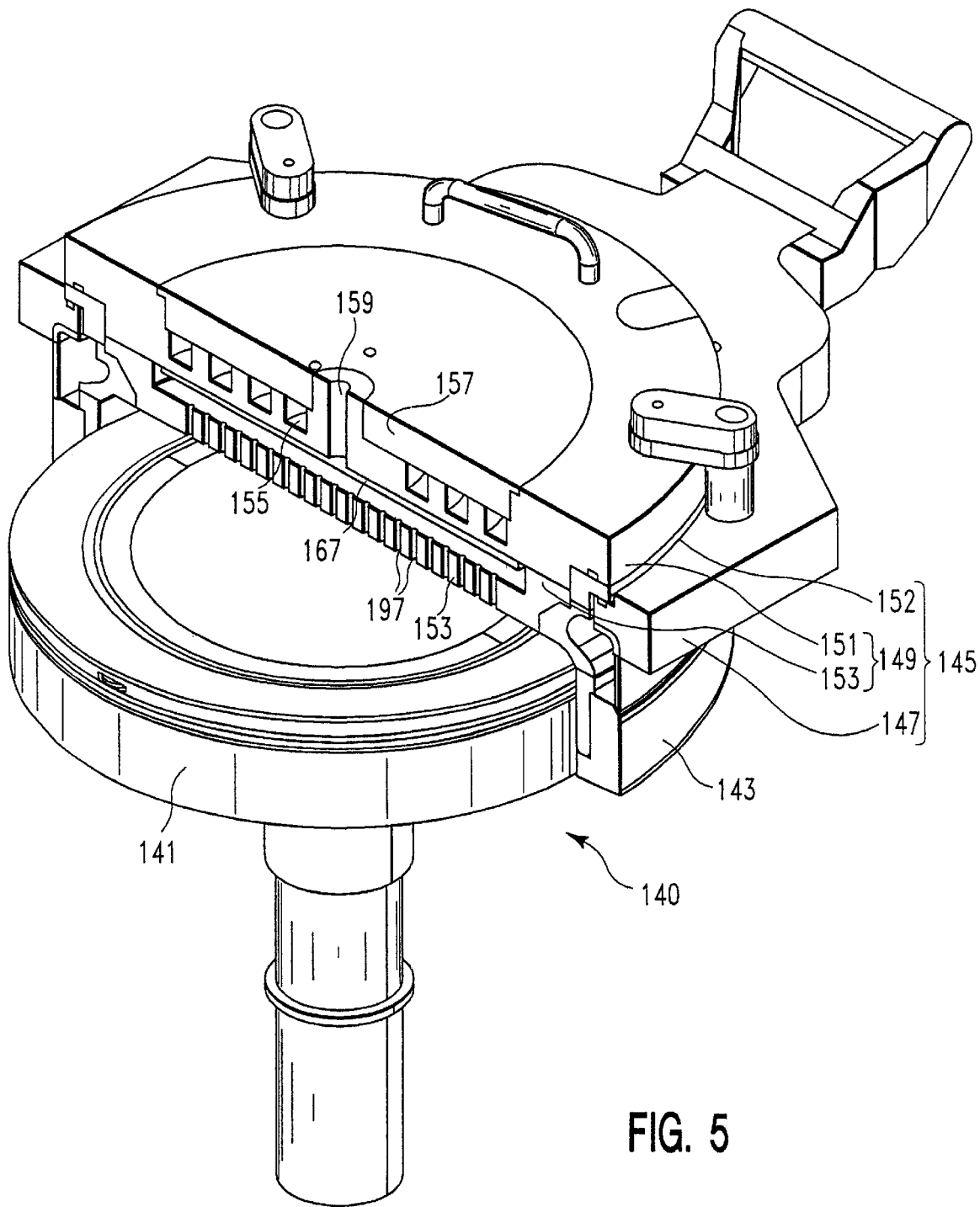
FIG. 5 is a partial perspective view of the CVD processing chamber of FIG. 4.

FIGS. 4 and 5 are a side cross sectional view and a partial perspective cutaway view, respectively, of a CVD processing chamber 140 having a chamber body 143 that defines a cavity. A pedestal 141 is disposed in the cavity of the chamber body 143 and supports a substrate 142 on its upper surface 144 for processing. A gas supply unit (not shown) provides precursor gases to the chamber 140 which react with the substrate 142. A vacuum system 255 communicates with a pumping channel 160 formed in the chamber 140 to evacuate the gases from the chamber 140. The vacuum pump 255 and the pumping channel 160 are selectively isolated by a valve 78 disposed between the pumping channel 160 and the vacuum pump 255.

The processing chamber 140 includes a lid assembly 145 disposed at an upper end of the chamber body 143. The lid assembly 145 comprises a number of components stacked on top of one another including a lid rim 147, an isolator ring 152, and a gas delivery assembly 149 each of which are described in greater detail below. A power supply 130 coupled to the lid assembly 149 provides power to thereto during processing.

The gas delivery assembly 149, comprising a temperature control plate 151 and a showerhead 153, will be described first with reference to FIG. 6 which is a sectional view of the lid assembly 145. The gas delivery assembly 149 incorporates various features designed to ensure good thermal contact during processing with minimal temperature gradients. Thus, the temperature control plate 151 (also known as a gas-feed cover plate, backing plate or waterbox), is shown having a fluid channel 155 formed therein to allow the heating or cooling of the temperature control plate 151 by flowing a fluid, such as deionized water, therethrough. The fluid channel 155 is a serpentine structure which preferably has an inlet end located towards the center of the plate temperature control plate 151 and an outlet end located toward the perimeter of the plate temperature control plate 151 such that fluid is flowed radially outward toward the perimeter of the temperature control plate 151. The channel fluid channel 151 is formed at an upper end of the temperature control plate 151 and is sealed by a cover 157. The temperature control plate 151 and the cover 157 are preferably made of aluminum or an aluminum alloy.

The temperature control plate 151 further includes a centrally located process gas inlet 159 adapted to deliver process gas to the showerhead 153. Although not shown, the process gas inlet 159 is coupled to one or more upstream gas sources and/or other gas delivery components, such as gas mixers. The process gas inlet 159 is in fluid communication with a gap 161 defined by a lower face 163 of the temperature control plate 151 and a recess 165 formed in the upper surface of the showerhead 153. The gap 161 is shaped and sized to accommodate a blocker plate 167 which is mounted to the plate temperature control plate 151. The blocker plate 167 is preferably made of an aluminum alloy and includes passageways 195 formed therein are adapted to disperse the gases flowing from the gas inlet 159 to the showerhead 153.

The temperature control plate 151 includes an annular mounting flange 173 formed at a perimeter of the plate temperature control plate 151. The flange annular mounting flange 173 is sized to rest on the isolator ring 152 and acts to support the gas delivery assembly 149. Preferably, a seal 175 is disposed in the flange annular mounting flange 173 to ensure a fluid-tight contact with the isolator ring 152.

The showerhead 153 is substantially disc-shaped and includes a plurality of vertically formed holes 197 to accommodate the passage of gases therethrough. The showerhead 153 is coupled to the lower face 163 of the temperature control plate 151 by a bolt 171 or similar fastener to ensure good thermal contact. The showerhead 153 and the control plate temperature control plate 151 comprise a unit supported by a flange annular mounting flange 173 disposed on the isolator ring 152.

Preferably, the showerhead 153 includes an annular mounting portion which includes an inner side wall 183, an outer side wall 185 and an upper seating surface 189. The upper seating surface 189 is a substantially planar surface and conforms to the lower face 163 of the plate temperature control plate 151. In mating abutment, the upper seating surface 189 and lower face 163 define an interface which is parallel to the radial axis 191 of the lid assembly 145 as shown in FIG. 6.

The material and dimensions of the lid assembly 145 are optimized to ensure thermal uniformity throughout the bulk of the showerhead 153 during processing. Preferably, the showerhead 153 is constructed of a material having a high thermal conductivity and low Rc such as an aluminum alloy with a highly finished surface. The thermal resistance is preferably less than about $5 \times 10^{-4}$ m$^2$K/W. The thickness t2 of the showerhead 153 (shown in FIG. 6) is measured by the length of the holes 197. In general, t2 is sufficient to minimize the thermal resistance, Rc, thereby increasing thermal conductance. While it is generally believed that increasing thermal mass can inhibit a rapid response to changing thermal conditions and thus can increase the time to reach a steady-state for a given power setting, the inventors have found that increasing the thickness of the showerhead 153 improves the temperature uniformity of the showerhead 153. The inventors postulate that this unexpected result is due to the dependence of heat/power input to the showerhead 153 on surface area rather than thickness and the greater dependence of energy output from the showerhead 153 on thickness. As the thickness is increased, the surface area of the showerhead 153 remains unchanged. Thus, the energy input to and stored in the showerhead 153 is unchanged with increasing thickness and a constant surface area. However, the inventors theorize that a relatively thicker plate is more efficient in carrying away the "fixed" input energy from the center of showerhead 153 to the perimeter of showerhead 153, thereby achieving greater thermal uniformity of the showerhead 153.

The particular dimensions of the showerhead 153 can be optimized for a particular application. In general, the diameter, d3, is preferably between about 12.0 inches and about 16.0 inches, while t2 is preferably between about 0.75 inches and 1.5 inches. In one embodiment, the showerhead 153 and plate temperature control plate 151 have a combined thickness, t3, of about 3.0 inches and a diameter, d3, of about 14.0 inches, while t2 is about 1.0 inch. As shown in FIG. 6, t3 is measured from the lower face of the showerhead 153 to the upper surface of the temperature control plate 151. Preferably, the combined thickness t3 is equal to the combined thickness of the prior art showerhead 40 and gas-feed cover plate 46 of FIG. 1, thereby allowing the invention to be readily retrofitted to existing chambers. Thus, any increase in the thickness of the showerhead 153 is offset by a proportional decrease in the thickness of the temperature control plate 151. However, where the size limitations of existing chambers are not a factor, the showerhead 153 and the temperature control plate 151 may be of any desired dimensions optimizing uniformity of the showerhead 153.

Figure 6:
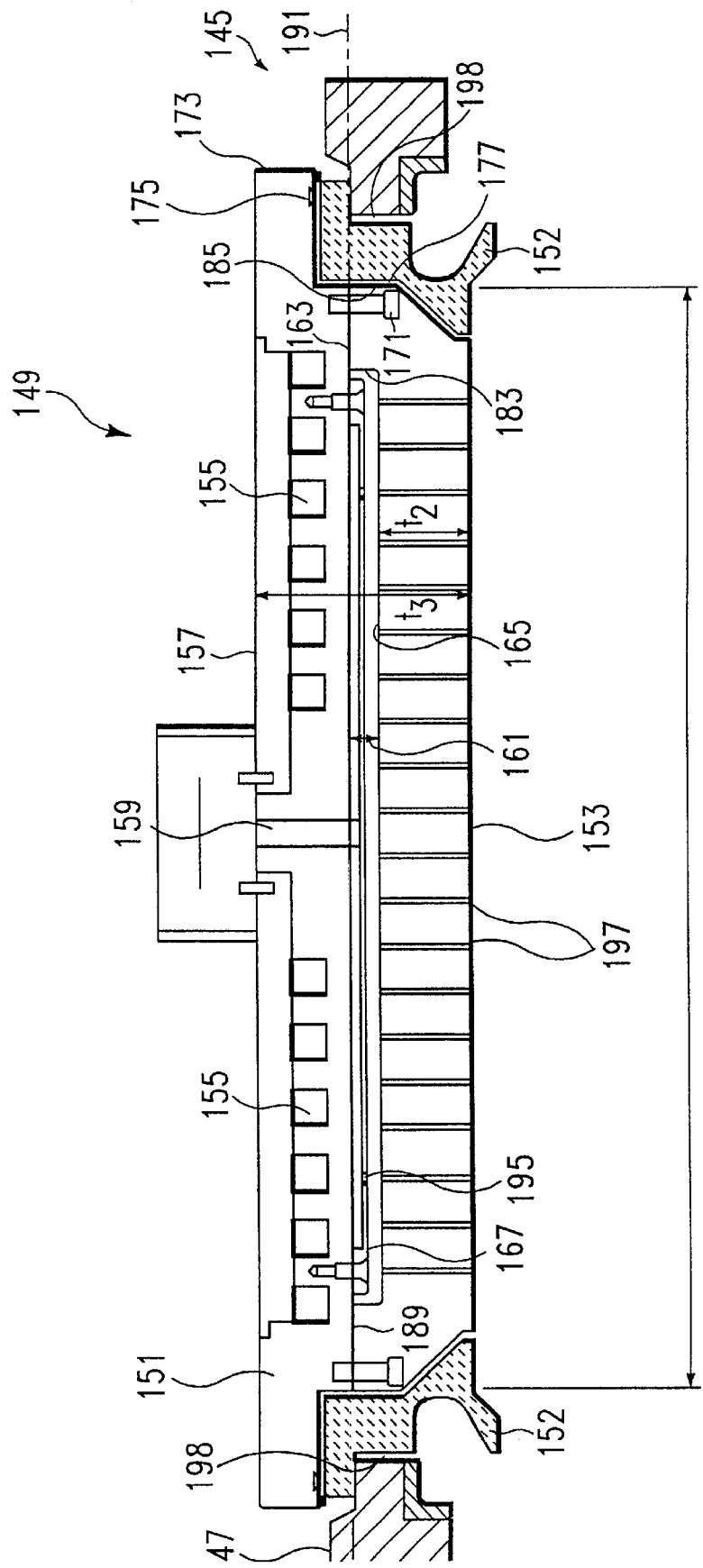
FIG. 6 is a cross-sectional view of the lid assembly of the present invention.

While the lid assembly 145 shown in FIGS. 4–6 is substantially disc-shaped the invention is not limited to a particular shape. Thus, parallelograms and other shapes are contemplated.

Figure 1:
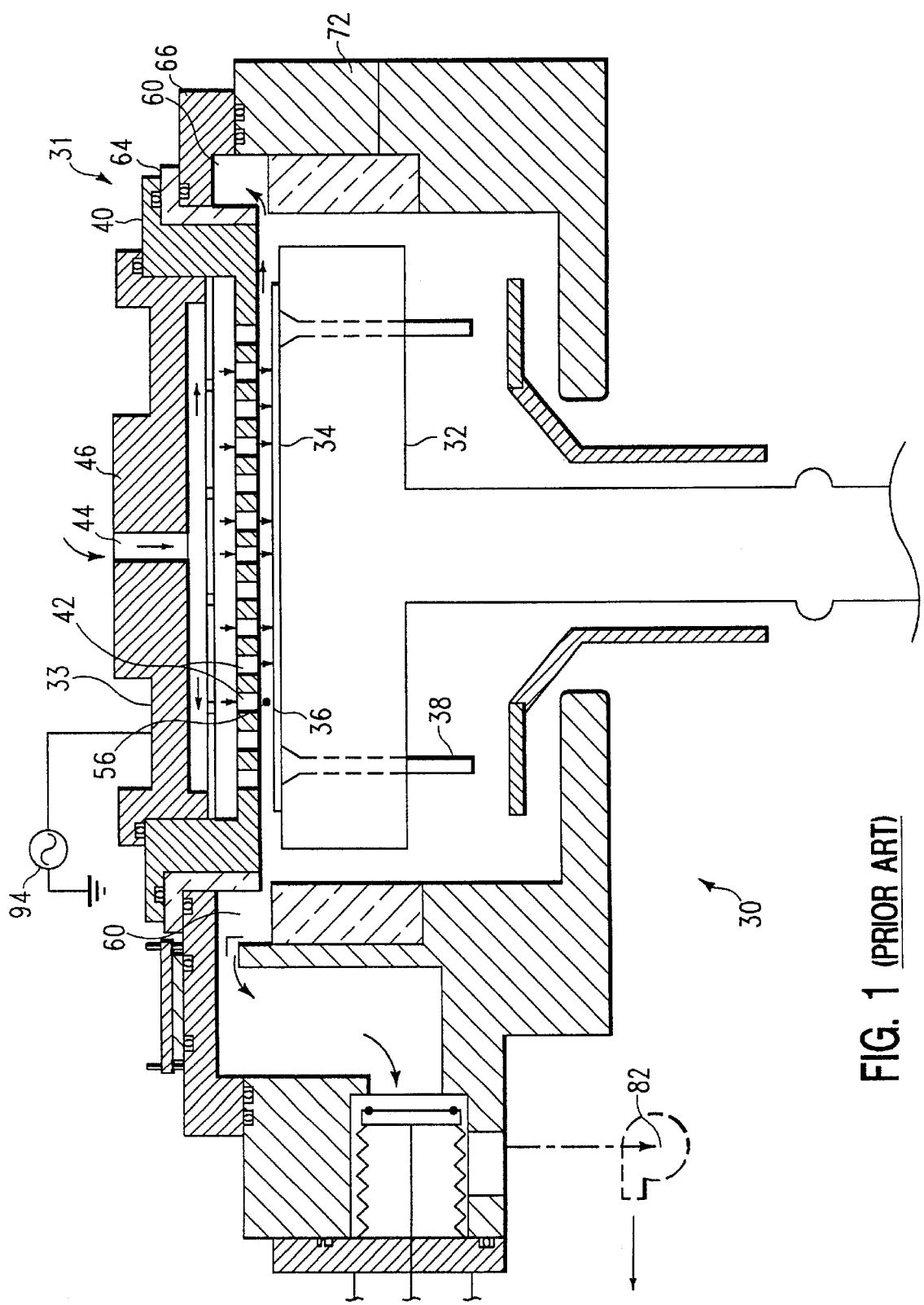
FIG. 1 is a cross-sectional view of a prior-art CVD processing chamber.
Figure 2:
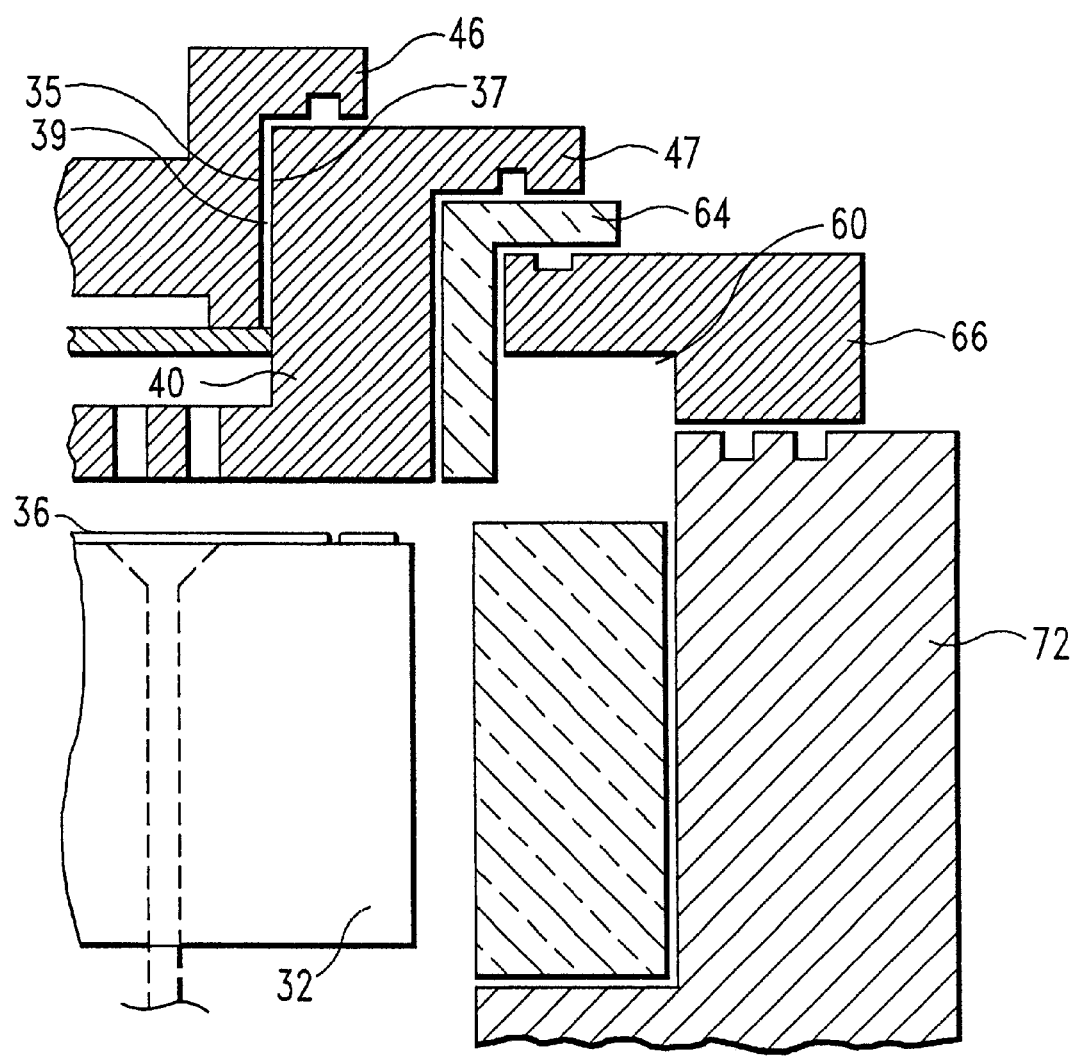
FIG. 2 is a schematic close-up view of the upper right-hand corner of the chamber as shown in FIG. 1.
Figure 3:
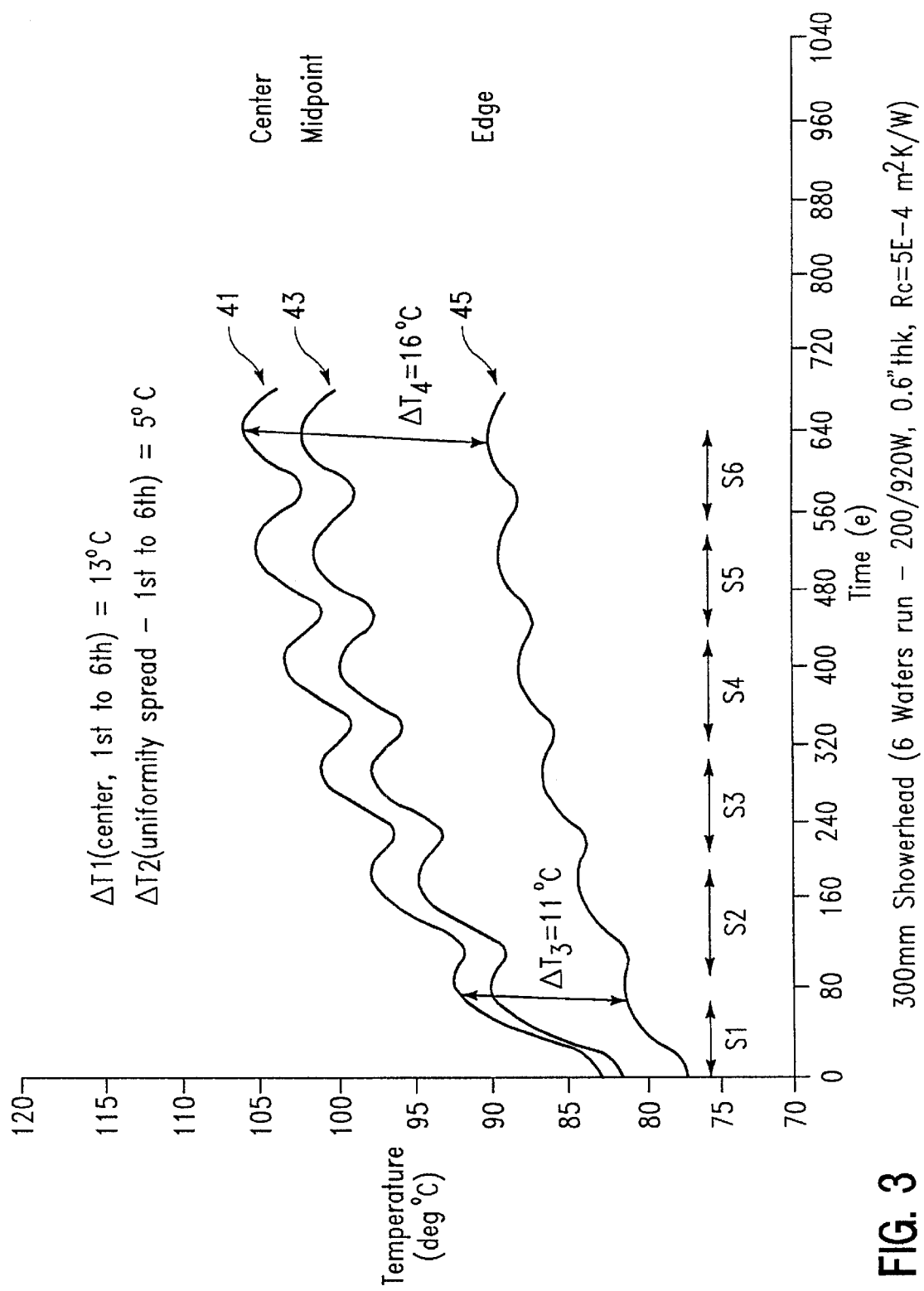
FIG. 3 shows a graphical representation of the temperature profile of a prior art showerhead during processing.

The lid assembly 145 provides substantial improvements over the prior art. As shown in FIG. 1, the prior art gas delivery assembly 31 comprised a showerhead 40 having an annular 47 flange adapted to support the showerhead 40 on the chamber body 72. The showerhead 153, as shown in FIGS. 4–6, eliminates the flange 47 shown in FIG. 1 and is coupled directly to the control plate 151 so that the showerhead 153 and the plate temperature control plate 151 can be removed as unit from the chamber body 143. Further, the interface between the showerhead 153 and the plate temperature control plate 151 is substantially parallel to a radial axis 191 of the lid assembly 145 (as shown in FIG. 6), which prevents formation of gaps as a result of thermal expansion during processing which insulate the components from one another. Rather, the surfaces merely tolerate some degree of relative lateral movement without separation.

Figure 7:
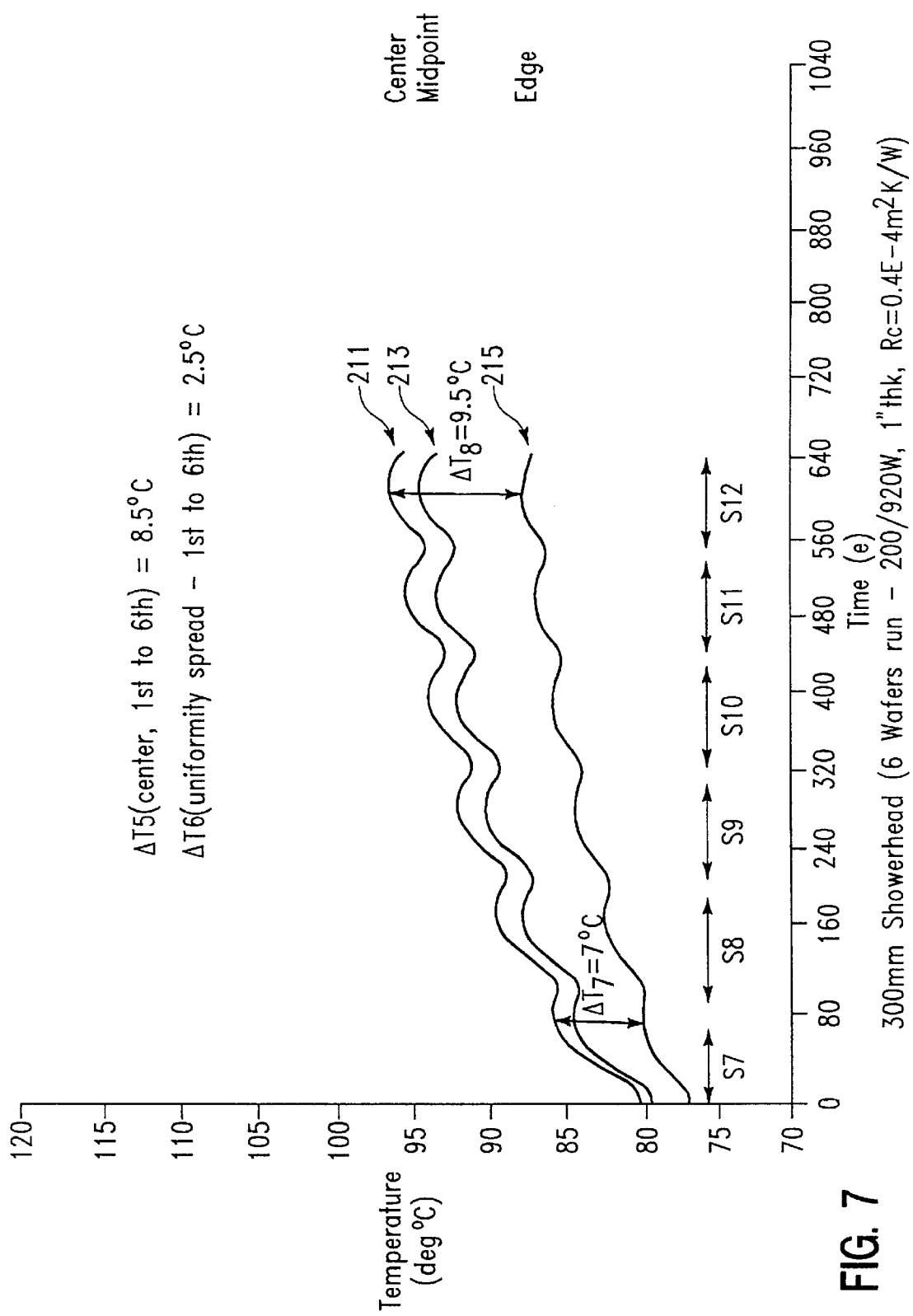
FIG. 7 shows a graphical representation of the temperature profile of a showerhead of the present invention during processing.

The improvement of the lid assembly 145 over conventional designs can be seen with reference to FIG. 7 which shows graphical representations of the temperature profile for the showerhead 153 for six substrates, S7–S12. The showerhead 153 (shown in FIG. 6) has a diameter d3 of about 16 inches and a thickness t2 is about one (1) inch. The applied power to the showerhead 153 from the power supply 130 was about 920W and the thermal contact resistance, Rc, was about $0.4 \times 10^{-4}$ m²K/W. Three curves 211, 213, 215 are shown representing the temperature fluctuations for the center, mid-portion, and edge, respectively, of the showerhead 153 for six substrates. The substrates are numbered S7–S12 and the process cycle for each corresponds to the upward sloping portion of the graphs. The temperature gradient for the center, $\Delta T_5$, for the six substrates is about 8.5° C. and the temperature uniformity spread, $\Delta T_6$, is about 2.5° C., where $\Delta T_5$ is defined as the change in temperature at the center of the showerhead 153 from the sixth substrate to the first $((T_{center})6^{th} - (T_{center})1^{st})$ and $\Delta T_6$ is defined as the difference of the center-to-edge temperature gradient between the sixth substrate and the first substrate $((T_{center} - T_{edge})6^{th} - (T_{center} - T_{edge})1^{st})$, shown in FIG. 7 as $\Delta T_8 - \Delta T_7$). Further, the difference in temperature $\Delta T_7$ between the center and the edge for the first substrate, S7, is about 7° C. and the difference in temperature $\Delta T_8$ between the center and the edge for the sixth substrate, S12, is about 9.5° C. Thus, the showerhead exhibited significant improvement over the prior art showerhead described above with reference to FIGS. 1–4. A comparison between a conventional showerhead, such as 40 shown in FIG. 1 and the showerhead 153 of the present invention are summarized in Table I below.

TABLE 1

| TiN Deposition | Prior Art Chamber | Present Invention |
|---|---|---|
| Contact Resistance (Rc) | $5 \times 10^{-4}$ m²K/W | $0.4 \times 10^{-4}$ m²K/W |
| Power (W) | 920 W | 920 W |
| Temperature Gradient for the Center for Six Substrates | $\Delta T_1$ = 13° C. | $\Delta T_5$ = 8.5° C. |
| Temperature Spread | $\Delta T_2$ = 5° C. | $\Delta T_6$ = 2.5° C. |
| Difference in Temperature Between the Center and the Edge for the First and Sixth Substrate | $\Delta T_3$:11° C. $\Delta T_4$:16° C. | $\Delta T_7$:7° C. $\Delta T_8$:9.5° C. |

Other features of the invention will now be discussed with reference to FIGS. 8–11. The chamber insert 154 includes an L-shaped ceramic ring 164 resting on the inside ledge 181 of the main chamber body 143 and also includes a band shield 166 resting on an inside ledge 168 on the L-shaped ring ceramic ring 164 and spaced from the pedestal 141 and a centering ring 146. The chamber insert 154 has a sealable passageway 156 (shown in FIG. 4) through it and through the main chamber body 143 for a robot blade (not shown) to transfer substrates into and out of the chamber 140. The band shield 166 is preferably made of a metal, such as aluminum, and extends vertically upwardly above the top of the L-shaped ceramic ring 164 and to a lesser extent above the upper surface 144 of the pedestal 141.

The annular pumping channel 160 has sides generally defined by the band shield 166, the L-shaped ring ceramic ring 164, liners 170, 172, and the isolator ring 152, with a choke aperture 150 being formed between the isolator ring 152 and the band shield 166. The liner 170 is placed on the side of the pumping channel 160 facing the lid rim 147 and conforms to its shape. Preferably, the liner 170 is detachably fixed to the lid rim 147 by a number of pins 174 (see FIG. 8) and is electrically grounded to the lid rim 147. The chamber liner 172 is placed on the side of the pumping channel 160 facing the main chamber body 143 and is supported on a ledge 176 formed on the outer top of the L-shaped ceramic ring 164. The chamber liner 172 has a diameter such that a radial gap 178 (see FIG. 8) is formed between the chamber liner 172 and the main chamber body 143, and an axial gap 180 is formed between the lid and chamber liners 170, 172. That is, the chamber liner 172 is electrically floating. Both liners 170, 172 are preferably made of a metal, such as aluminum, and are bead blasted to increase the adhesion of any film deposited thereon, thereby preventing flaking of material which results in contamination of the chamber 140.

The band shield 166 and the lid and chamber liners 170, 172 are sized as a set. The band shield 166 is annular having a diameter d1 and is disposed about the center of pedestal 141. The chamber liner 172 is also annular in the shape of a band extending axially along the centerline of the pedestal 141 and with a diameter d2 greater than d1. The lid liner 170 is also annular and has an L-shape with a long leg portion extending radially along radial axis 191 from about d1 to d2 and a short leg extending axially at about d2 and adapted to receive pins 174 to secure the lid liner 170 to the chamber body 143.

The isolator ring 152 for the embodiment of the invention illustrated in FIGS. 4–6 and as best shown in FIG. 11 has a monolithic ring-like structure forming an opening 236 and is preferably manufactured of ceramic. The isolator ring 152 generally includes an upper lip 238, a lower inner lip 239 protruding inwardly to define an inner diameter of the central opening 236 and a lower outer lip 237 with a lower body surface 240. Additionally, a concave surface 242 is formed in an outer portion of the isolator ring 152 to increase the cross-sectional area of the pumping channel 160, thereby allowing for an increase in pumping speed and uniformity. Further, the concave surface is rounded with a large radius of curvature to accommodate material stresses resulting during operating conditions. The lower inner lip 239 has a sloping top surface 241 which, along with a front generally upright surface 246, defines the inner perimeter of the isolator ring 152. As shown in FIG. 6 the sloping top surface 241 conforms to the shape and slope of the showerhead 153. A plasma confining wall 245 is formed between the lower inner lip 239 and the lower body surface 240 and flares outwardly away from the showerhead 153 (shown in FIG. 6). Thus, the plasma confining wall 245 is angularly disposed much like the inner surface of a frustoconical section. The angular disposition of the plasma confining wall 245 is adapted to form an obstruction and a confinement for the processing gas(es) and/or plasma such that the processing gas(es) and/or plasma do not have a straight passageway into the pumping channel 160 (shown in FIG. 8).

The operation of the invention can be understood with reference to FIGS. 4 and 9 and occasionally to other figures where indicated in the following description. With the pedestal 141 in a lowered receiving position, a robot (not shown) is actuated through the sealable passageway 156 to a position above the pedestal 141. Lift fingers 199 then move upwardly through the pedestal 141 to lift the substrate from the robot. After the robot is retracted from the chamber 140, the pedestal 141 is raised while the lift fingers 199 are kept stationary so that the substrate is lowered onto the upper surface 144 of the pedestal 141. Once the pedestal 141 reaches a terminal processing position, gas is supplied to the gas delivery assembly 149 by one or more gas sources not shown. Gas entering the process gas inlet 159 is distributed into the gap 161, through passageways 195 in the blocker plate 167 and then through the plurality of holes 197 formed in the showerhead 153 where it is delivered to the processing region 235.

Upon delivery to the processing region 235, the gas contacts the substrate 142 and reacts therewith. Unreacted gas and gaseous byproducts are then exhausted from the chamber 140 under the influence of the negative pressure provided by a vacuum pump 255. Accordingly, the gas flows through the choke aperture 150 formed between the bottom body surface 240 (shown in FIG. 8) of the annular isolator ring 152 and the top of the shield 154 and into the pumping channel 160.

The choke aperture 150 has a substantially smaller width than the depth of the processing region 235 and is substantially smaller than the minimum lateral dimensions of the pumping channel 160. The width of the choke aperture 150 is made small enough and its length long enough, so as to create sufficient aerodynamic resistance at the operating pressure and gas flow rate to result in a pressure drop across the choke aperture 150 substantially larger than any pressure drop across the radius of the substrate 142 or around the circumference of the annular pumping channel 160. In one embodiment, the choke aperture 150 introduces enough aerodynamic impedance that the pressure drop from the middle of the substrate 142 to a point within the pumping channel 160 is no more than 10% of the circumferential pressure drop within the pumping channel 160.

Figure 9:
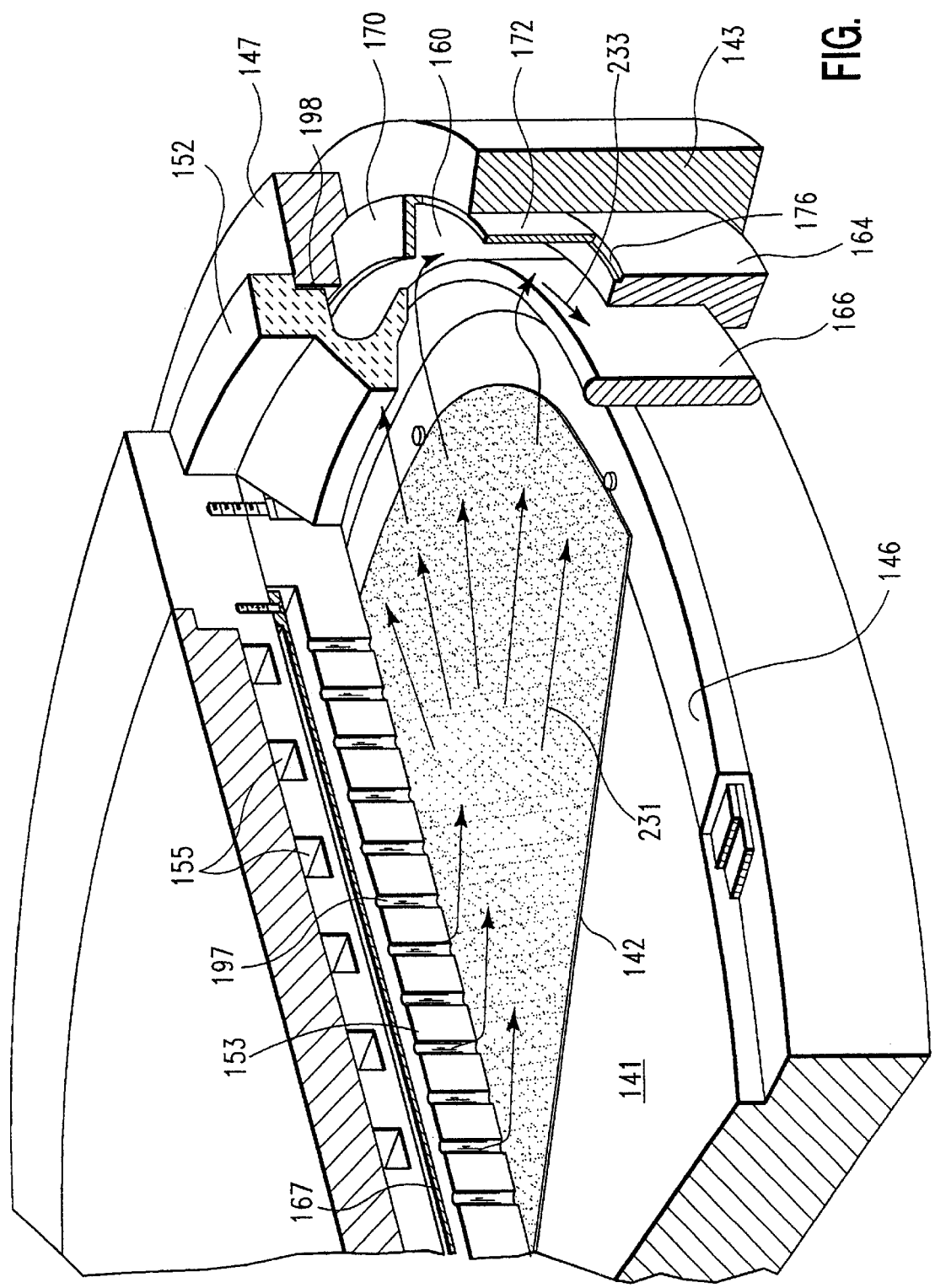
FIG. 9 is a perspective cutaway view of the processing chamber in FIG. 4.

The gas flow relative to the substrate 142 and into the pumping channel 160 is shown in FIG. 9, which is a sectional, perspective view of the chamber 140, the pedestal 141, the centering ring 146 and the liners 170, 172 and shields 164, 166 surrounding the pumping channel 160. After flowing into the chamber 140 through the plurality of holes 197, the process gas flows radially outwardly, as shown by arrows 231, across an edge of a substrate 142, and across the peripheral centering ring 146. Upon entering the pumping channel 160, the gas is routed around the perimeter of the process chamber 140, as shown by arrow 233 in FIG. 9, to be evacuated by the vacuum pump 255 connected to the process chamber 140.

Various designs have been implemented in the invention to avoid problems related to material buildup on chamber components. As most clearly shown in FIG. 8, the pumping channel 160 and its components are designed to minimize the effect of any deposited conductive film upon the excitation of a plasma in and near the processing region 235. Since the band shield 166 rises above the level of the substrate 142 and over the top 186 of the L-shaped ring ceramic ring 164, a dead space 184 is created in the flow pattern at the bottom of the pumping channel 160 adjacent to the top 186 of the L-shaped ring ceramic ring 164. As a result, even though metal may deposit on the upper portion of the band shield 166, the dead space 184 ensures that a significant thickness of metal will not deposit around the backside of the band shield 166. In particular, an insufficient amount of metal will deposit to bridge a gap 188 formed between the band shield 166 and the L-shaped ceramic ring 164. Thus, although conducting, the band shield 166 remains electrically floating with respect to the main chamber body 143 as well as the pedestal 141.

Figure 8:
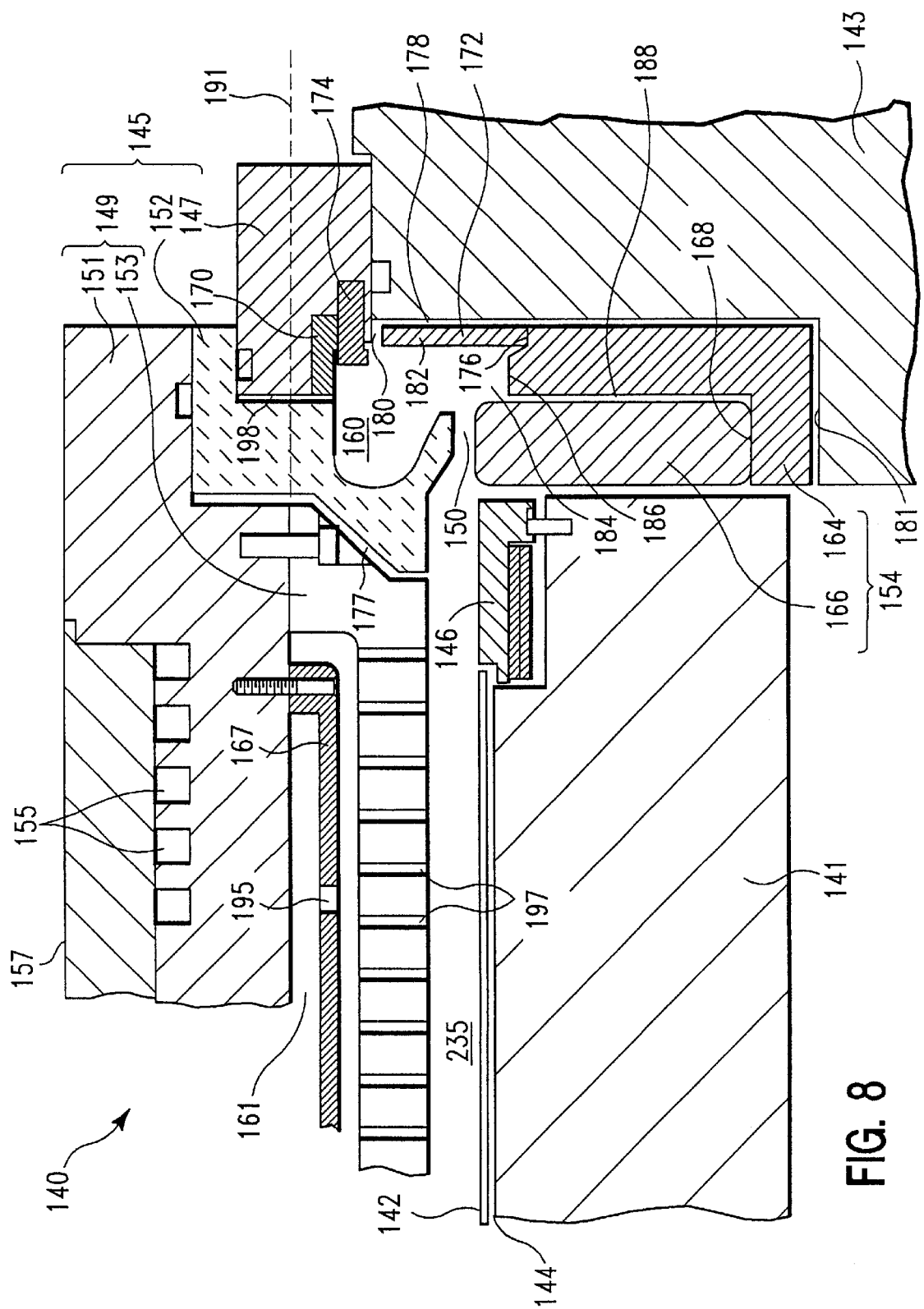
FIG. 8 is an enlarged view of the upper right-hand corner of the chamber of FIG. 4.

The band shield 166 has rounded ends to reduce the possibility of arcing. Referring still to FIG. 8, it is possible for the process gas to flow through choke aperture 150, through the axial gap 180 at the top of the chamber liner 172 and then deposit a conductive film 182 in the axial gap 180 and in the radial gap 178 on the backside of the chamber liner 172. Since both gaps 178, 180 are dead space, it is unlikely that enough thickness would deposit to bridge either gap 178, 180. Further, in the event deposits 182 become sufficient to bridge 178, 180, any short across the gap would only ground the chamber liner 172. Another extraneous film in the pumping channel 160 would be required to bring the ground from the main chamber body 143 close enough to the processing region 235 to significantly affect the plasma fields. Very little, if any, gas will progress down to the bottom end of the radial gap 178 where deposition, if it occurs, might create a bridge between the chamber liner 172 and the main chamber body 143. However, because the chamber liner 172 is mounted on an outside ledge 176 of the insulating L-shaped ring ceramic ring 164, a conductive film would have to fill the gap between the L-shaped ring ceramic ring 164 and the chamber body 143 for the ground of the chamber body 143 to extend to the band shield 166.

Figure 10:
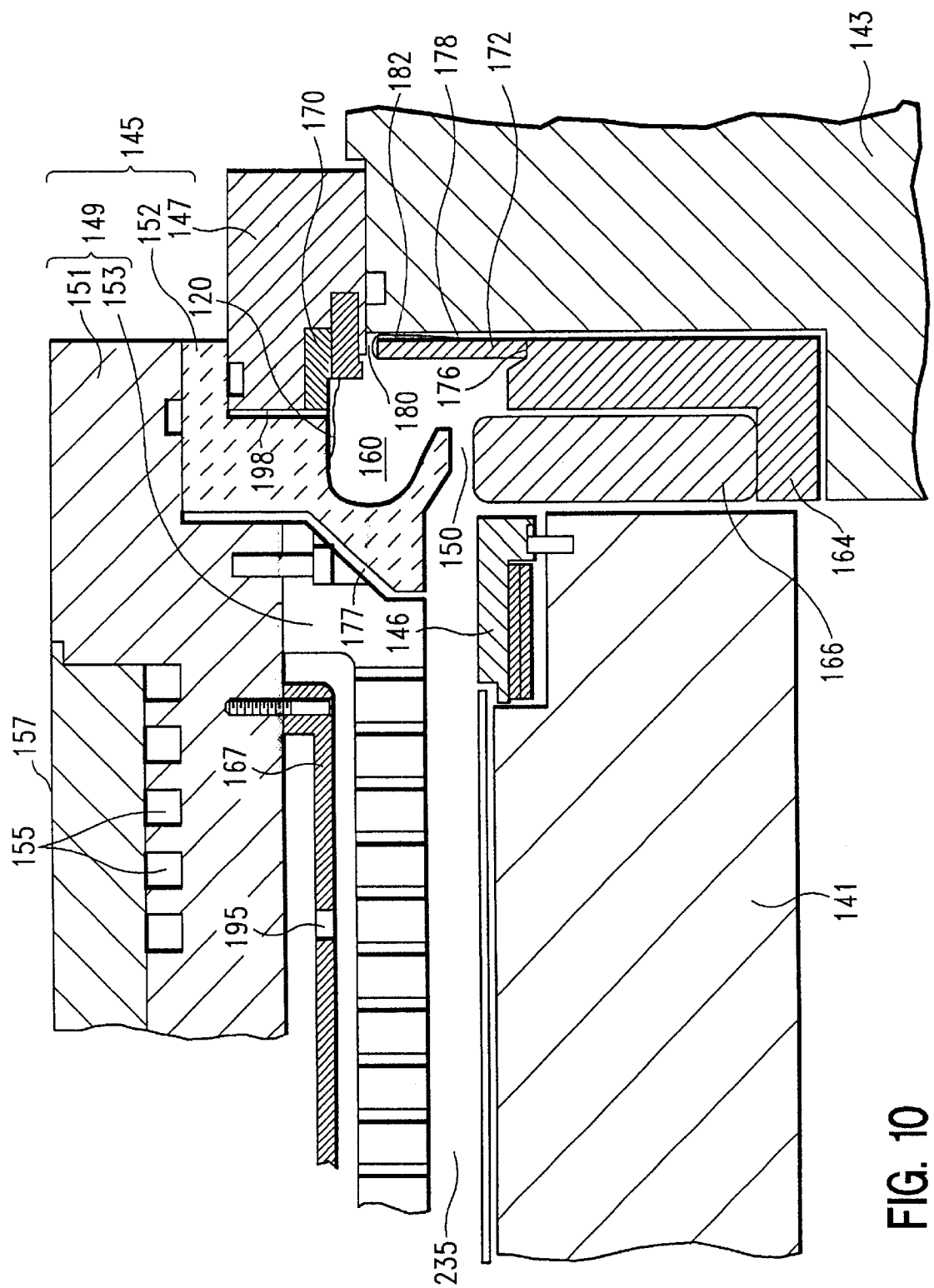
FIG. 10 is the enlarged view of the upper right-hand corner of the processing chamber in FIG. 4 showing the buildup of a conductive film around a pumping channel liner.

As shown in FIG. 10, an extraneous conductive film 120 deposited on the isolator ring 152 on surfaces in and near the pumping channel 160 has the potential of extending the grounding plane of the lid rim 147 to the area adjacent to the biased showerhead 153 to significantly perturb the plasma electric fields and perhaps even to short the biased showerhead 153 across the isolator ring 152 to the chamber lid rim 147. Therefore, gaps are provided between selected chamber components to mitigate the potential for arcing. A first gap 177 is formed between the isolator and the gas delivery assembly. The gap is adapted to minimize the amount of diffusion of material into the gap which can result in the formation of conducting surfaces on the chamber components while also preventing arcing in the event that conducting surfaces are formed. In one embodiment, an optimal gap is about 0.4 inches. However, more generally, the gap size is determined according to a particular application. Similarly, a second gap 198 is provided between the isolator ring 152 and the lid plate 147 to further enhance arcing resistance. With this structure, even if the extraneous film 120, as illustrated in FIG. 10, does deposit on the isolator ring 152, it does not form a continuous conductive film.

The lid liner 170, as illustrated in FIG. 10, is metallic and is both thermally and electrically connected to the lid rim 147, effectively forming an extension of it, and because of its remote location does not easily affect the plasma in the processing region 235. Any metal depositing on the lid liner 170 will not further affect the plasma as long as the metal does not extend over the isolator ring 152. In any case, the lid liner 170 is easily removed for cleaning of replacement by means of the pins 174 when it becomes excessively coated.

The pumping chamber liners 170, 172 and the centering ring 146 can be easily replaced with new or refurbished components whenever films, particularly conductive films, inevitably build up on them. However, testing in a realistic operating environment has shown that even after 3000 substrates, the novel design has minimized the deposition to the point that they do not need to be replaced. Thus, the invention substantially reduces downtime of the CVD chamber 140 while providing superior plasma conditions.

The processing chamber 140 illustrated in FIGS. 4–6 and 8 may be used for any suitable purpose which would be readily discernible to those artisans possessing ordinary skill in the art and for which the spirit and scope of the present invention would cover. One suitable use for the processing chamber 140 for this embodiment of the invention would be for forming a CVD layer (e.g. a CVD layer comprising TiN) on the substrate or substrate 142.

Titanium nitride is a moderately good electrical conductor, but in semiconductor processing it is used primarily to function as a barrier layer and as a glue layer. This process is often applied to the contact structure illustrated in the cross-sectional view of FIG. 12 in which an oxide layer 100, typically $SiO_2$, is deposited over a silicon substrate 102 and then a contact hole 104 is etched through the oxide layer 100. The contact hole 104 is then filled with a metal such as aluminum. However, in advanced integrated circuits, the contact hole 104 is narrow, often less than 0.35 $\mu$m, and has an aspect ratio of 3 or more. Filling such a hole is difficult, but a process has been developed in which the hole contact 104 is first conformally coated with a titanium layer 106, and the titanium layer 106 is then conformally coated with a titanium nitride layer 108. Thereafter, an aluminum layer 110 is deposited, usually by physical vapor deposition, to fill the contact hole 104 and to provide electrical interconnection lines on the upper level. The Ti layer 106 provides a glue layer to both the underlying silicon and the oxide on the sidewalls. Also, it can be silicided with the underlying silicon to form an ohmic contact. The TiN layer 108 bonds well to the Ti layer 106, and the aluminum layer 110 wets well to the TiN so that the aluminum can better fill the contact hole 104 without forming an included void. Also, the TiN layer 108 acts as a barrier to prevent the aluminum 110 from migrating into the silicon 102 and affecting its conductivity.

Titanium and titanium nitride can be deposited by either CVD or PVD, but CVD enjoys the advantage of more easily forming conformal layers in a hole having a high aspect ratio. One CVD process for conformally coating TiN in a narrow hole is the TDMAT process.

In the TDMAT process, a precursor gas of tetrakis-dimethylamido-titanium, $Ti(N(CH_4)_2)_4$, is injected into the chamber through the showerhead 153 at a pressure from about 1 to about 9 Torr while the pedestal 141 holds the substrate 142 at an elevated temperature of about 360° C or higher, More particularly from about 360° C. to about 450° C. Thereby, a conductive and conformal TiN layer is deposited on the substrate 142 in a CVD process. However, it has been found that the TiN layer initially formed by the TDMAT process includes an excessive amount of carbon in the form of included polymers which degrade its conductivity. Thus, the TDMAT deposition is usually followed by a second step of plasma treating the deposited TiN layer. The TDMAT gas in the chamber is replaced by a gas mixture of $H_2$ and $N_2$ in about 50:50 ratio at a pressure of 0.5 to 10 Torr, and the power supply 130 is switched ion on to create electric fields between the showerhead 153 and the pedestal 141 sufficient to discharge the $H_2:N_2$ gas to form a plasma. The hydrogen and nitrogen species in the plasma reduce the carbonaceous polymer to volatile byproducts which are exhausted from the system. The plasma treatment thereby removes the carbon to improve the quality of the TiN film.

Although the invention has been described with respect to CVD of TiN, the invention is obviously applicable to other processes. For example, the titanium layer 104 can be deposited by a plasma process using $TiCl_4$ as the precursor and using the thermal TDMAT process for the TiN layer. Also, the process can be advantageously applied to CVD of conductive metal oxides, such as perovskites including lanthanum oxide. The invention is, of course, applicable to many other types of metal CVD processes and should be useful in dielectric CVD and other plasma applications as well.

Thus, while the present invention has been described herein with reference to particularly embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particularly situation or material to the teachings of the invention without departing from the essential scope and spirit of the present invention. It is intended that the invention not be limited to the particular embodiment disclosed as the best mode contemplated for carrying out this invention, but that the invention will conclude all embodiments and equivalents falling within the scope of the appended claims.

While the foregoing is directed to the preferred embodiment of the present invention, other and further embodiments of the invention may be devised without departing from the basic scope thereof, and the scope thereof is determined by the claims that follow.

What is claimed is:

1. A faceplate for a chemical vapor deposition chamber showerhead assembly, comprising:
   (a) a central monolithic portion comprising an upper face and a lower face and including a plurality of gas outlet holes extending between the upper face and the lower face; and
   (b) an annular raised shoulder concentrically disposed about a perimeter of the central monolithic portion and having a substantially planar temperature control plate mounting surface disposed generally parallel to the lower face.

2. The faceplate of claim 1, wherein the annular raised shoulder defines one or more mounting bores for receiving fasteners.

3. The faceplate of claim 1, wherein the gas outlet holes are oriented in a first direction generally perpendicular to the lower face and the substantially planar mounting surface.

4. The faceplate of claim 1, wherein a diameter of the faceplate is greater than about 12 inches and a thickness of the faceplate between the upper and lower faces is greater than about 0.75 inches.

5. The faceplate of claim 1, wherein a diameter of the faceplate is between about 12 inches and 16 inches and a thickness of the faceplate between the upper and lower faces is between about 0.75 inches and 1.5 inches.

6. The faceplate of claim 1, wherein a thermal contact resistance (Rc) of the faceplate is between about $0.4 \times 10^{-4}$ $m^2 K/W$ and about $2.0 \times 10^{-4}$ $m^2 K/W$.

7. The faceplate of claim 1, wherein the faceplate comprises a material selected from the group of aluminum and aluminum alloys.

8. An apparatus, comprising:
   (a) a chamber body defining a processing cavity;
   (b) a substrate support member disposed in the processing cavity; and
   (c) a lid assembly disposed at one end of the chamber body, the lid assembly comprising:
      (i) a temperature control plate having an annular mounting flange and a lower mounting surface; and
      (ii) a faceplate coupled to the temperature control plate, the faceplate comprising:
         (1) a perforated portion having an upper face and a lower face; and
         (2) a perimeter upper mounting surface in mating abutment with the lower mounting surface of the temperature control plate, wherein the lower mounting surface of the temperature control plate is parallel to the lower face of the faceplate.

9. The apparatus of claim 8, wherein an interface between the lower mounting surface and the upper mounting surface is adapted to accommodate lateral thermal expansion during processing so that contact is maintained between the lower mounting surface and the upper mounting surface.

10. The apparatus of claim 8, wherein a diameter of the faceplate is greater than about 12 inches and a thickness of the faceplate between the upper face and the lower face is greater than about 0.75 inches.

11. The apparatus of claim 8, wherein a diameter of the faceplate is between about 12 inches and 16 inches and a thickness of the faceplate between the upper face and the lower face is between about 0.75 inch and 1.5 inches.

12. The apparatus of claim 8, wherein the faceplate is made of a material and has a thickness to provide a thermal contact resistance of the faceplate between about $0.4 \times 10^{-4}$ $m^2 K/W$ and about $2.0 \times 10^{-4}$ $m^2 K/W$.

13. The apparatus of claim 8, further comprising a blocker plate having a plurality of holed formed therein disposed between the faceplate and the temperature control plate.

14. The apparatus of claim 8, wherein the temperature control plate comprises:
   (a) a gas inlet disposed at least partially through the temperature control plate providing fluid communication to the perforated portion of the faceplate; and
   (b) one or more cooling channels formed at least partially in the temperature control plate.

15. The apparatus of claim 8, further comprising a power supply coupled to the faceplate.

16. The apparatus of claim 8, wherein the faceplate comprises a material selected from the group of aluminum and aluminum alloy.

17. The apparatus of claim 8, wherein the lid assembly further comprising:
   (a) a lid rim disposed on the chamber body and around the faceplate; and
   (b) an isolator ring disposed between the lid rim and the lid assembly and around the faceplate.

18. The apparatus of claim 8, further comprising one or more mounting bores formed in the faceplate and the temperature control plate.

19. The apparatus of claim 18, further comprising a fastener disposed through each of the mounting bores to couple the faceplate and the temperature control plate to one another.

20. The faceplate of claim 1, wherein the central monolithic portion and the annular raised shoulder are formed of a single piece of material.

21. The faceplate of claim 1, further comprising a temperature control plate coupled to the substantially planar temperature control plate mounting surface.

22. The apparatus of claim 8, wherein the temperature control plate comprises a body defining a plurality of fluid channels.

23. A gas delivery assembly for a semiconductor processing system, comprising:
   (a) a temperature control plate having a substantially planar lower mounting surface; and
   (b) a faceplate coupled to the substantially planar lower mounting surface, wherein the faceplate comprises a perforated portion having gas holes formed therein and a perimeter mounting surface in mating abutment with the substantially planar lower mounting surface, and wherein a thermal contact resistance of the faceplate is between about $0.4 \times 10^{-4}$ $m^2 K/W$ and about $2.0 \times 10^{-4}$ $m^2 K/W$.

24. The gas delivery assembly of claim 23, wherein a diameter of the faceplate is between about 12 inches and 16 inches and a thickness of the faceplate between an upper face and a lower face is between about 0.75 inches and 1.5 inches.

25. The gas delivery assembly of claim 23, wherein a diameter of the faceplate is greater than about 12 inches and a thickness of the faceplate between an upper face and a lower face is greater than about 0.75 inches.

26. The gas delivery assembly of claim 23, wherein the faceplate comprises:

(a) an upper face;

(b) a lower face;

(c) an annular shoulder disposed at a perimeter of the faceplate and having a substantially planar upper mounting surface disposed parallel to the lower face and in mating abutment with the substantially planar lower mounting surface of the temperature control plate; and (d) a plurality of gas outlet holes extending between the upper face to the lower face.

27. The gas delivery assembly of claim 23, wherein the substantially planar upper mounting surface and the substantially planar lower mounting surface are parallel to the lower face of the faceplate.

28. The gas delivery assembly of claim 27, wherein the substantially planar upper mounting surface and the substantially planar tower mounting surface are adapted to accommodate lateral thermal expansion during operation.

29. The gas delivery assembly of claim 23, further comprising a blocker plate having a plurality of holes formed therein disposed between the faceplate and the temperature control plate.

30. The gas delivery assembly of claim 23, wherein the temperature control plate comprises:

(a) a gas inlet disposed at least partially therethrough and providing fluid communication to the perforated portion of the faceplate; and (b) one or more cooling channels formed at least partially therein.

31. The gas delivery assembly of claim 23, wherein the faceplate comprises a material selected from the group of aluminum and aluminum alloy.

32. The gas delivery assembly of claim 23, further comprising one or more mounting bores formed in the faceplate and the temperature control plate.

33. The gas delivery assembly of claim 32, further comprising a fastener disposed in each of the mounting bores to couple the faceplate and the temperature control plate to one another.

* * * * *

UNITED STATES PATENT AND TRADEMARK OFFICE
CERTIFICATE OF CORRECTION

PATENT NO.    : 6,364,949 B1
DATED         : April 2, 2002
INVENTOR(S)   : Or et al.

It is certified that error appears in the above-identified patent and that said Letters Patent is hereby corrected as shown below:

<u>Column 1,</u>
Line 52, please change "arc" to -- are --.

<u>Column 5,</u>
Line 26, please change "comer" to -- corner --.

Signed and Sealed this

Thirteenth Day of May, 2003

JAMES E. ROGAN
*Director of the United States Patent and Trademark Office*